(12) United States Patent
Tsai

(10) Patent No.: US 7,282,417 B1
(45) Date of Patent: Oct. 16, 2007

(54) ION DOPING METHOD TO FORM SOURCE AND DRAIN

(75) Inventor: Nan-Hsiung Tsai, Shanghai (CN)

(73) Assignee: Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 11/527,505

(22) Filed: Sep. 27, 2006

(51) Int. Cl.
*H01L 21/336* (2006.01)

(52) U.S. Cl. .................. 438/301; 438/197; 438/303; 438/549; 438/585; 438/976

(58) Field of Classification Search ............... 438/301, 438/197, 303, 549, 585, 976
See application file for complete search history.

(56) References Cited

U.S. PATENT DOCUMENTS 7,115,509 B2 * 10/2006 Chen et al. .................. 438/684

* cited by examiner

*Primary Examiner*—Jack Chen
(74) *Attorney, Agent, or Firm*—Rosenberg, Klein & Lee

(57) ABSTRACT

An ion doping method to form source and drain is disclosed. First form a gate structure and a gate spacer on a semiconductor substrate, and then use dielectric layer having trenches therein to define heavily ion-doped positions and use a Y-shaped polysilicon layer formed in the trenches. Perform an ion implantation, by using the polysilicon layer, gate spacer and dielectric layer as a barrier layer, to naturally form ion doped regions of source/drain, so as to make components, which are minimized in the increased packing density, still have a gate structure keeping an enough channel length.

7 Claims, 6 Drawing Sheets

ION DOPING METHOD TO FORM SOURCE AND DRAIN

BACKGROUND OF THE INVENTION

1. Field of the Invention

The present invention relates to an ion doping method to form source and drain, and more particularly to an ion doping method suitable to form source and drain at the deep submicron scale.

2. Description of the Related Art

With the progress of the semiconductor technology, the number of components on per unit area of a wafer increases according to Moore's law. Yet the density distribution of transistors becomes higher and higher, and the size of components becomes smaller and smaller. These will make the manufacturing process, such as the photomask pattern transfer, ion implantation and deposition, more difficult.

After the junction of a gate and source/drain becomes shallow at the deep submicron scale, the doping profile of shallow or deep ions is the main key to control the short channel effect and device driving characteristics. The conventional manufacturing process is shown in FIG. 1. First, ions are doped lightly into semiconductor substrate 12 by using gate structure 10 as a mask, and then gate spacers 14 are formed at two sides of gate structure 10. Later, dope ions heavily and anneal, by using gate structure 10 and gate spacers 14 as a mask, to form lightly doped source/drain regions 16 and heavily doped source/drain regions 18, whose concentration distribution is steep. While such manufacturing technology is adapted in the deep submicron manufacturing process, the side length of the extension regions of doped source/drain regions 16 will make the channel length shorter. At this time, electrons easily penetrate the extension regions to lead to leakage current.

Therefore, the present invention proposes an ion doping method to form source and drain to solve the above mentioned problems.

SUMMARY OF THE INVENTION

An objective of the present invention is to provide an ion doping method to form source and drain, which uses a Y-shaped polysilicon layer, gate spacer and dielectric layer to be as a barrier layer when ions implanted, so as to make ions implanted into a semiconductor substrate diffuse naturally to form heavily doped source/drain regions and lightly doped source/drain regions in order to obtain a better ion doping profile of source and drain and to keep a better channel length.

Another objective of the present invention is to provide an ion doping method to form source and drain, which effectively controls a channel length and the size of the overlapping regions between doped regions and a gate structure, so as to be suitable for components minimized at the deep submicron manufacturing process.

To achieve the abovementioned objectives, the present invention presents an ion doping method to form source and drain. This invention first provides a semiconductor substrate formed several isolation regions therein. Then, form a gate structure and a gate spacer on the semiconductor substrate, and later deposit a dielectric layer on the semiconductor and etch the dielectric layer to form several trenches whose bottoms expose the source/drain position of the gate structure. Then, deposit a polysilicon layer in the trenches, and afterwards use the polysilicon layer as a mask to perform an ion doping process to form heavily doped source/drain regions and lightly doped source/drain regions. Later, remove the polysilicon layer to complete a gate component.

It is to be understood that both the foregoing general description and the following detailed description are exemplary, and are intended to provide further explanation of the invention as claimed.

DESCRIPTION OF THE PREFERRED EMBODIMENTS

The present invention relates an ion doping method to form source and drain. This method is suitable to the component manufacturing at the deep submicron scale, and thus makes a gate obtain a nice ion doping profile of source/drain regions and a good channel length at such a small scale.

Figure 1:
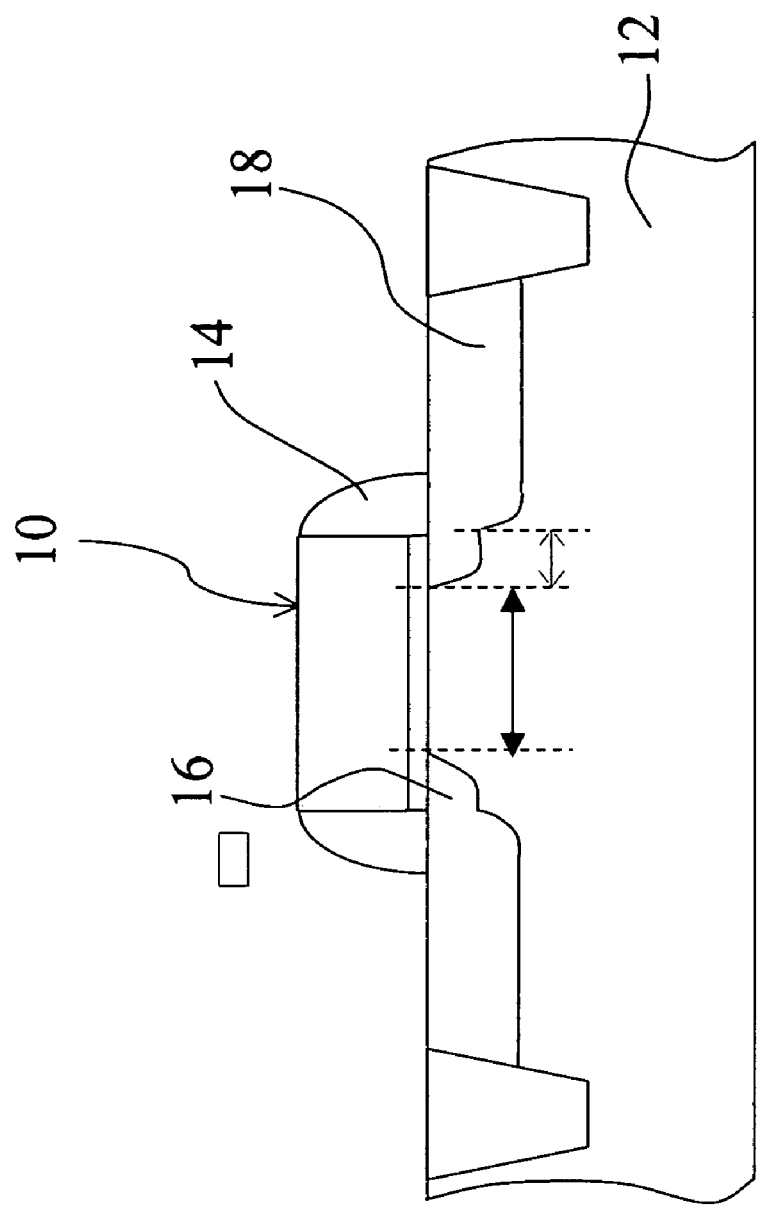
FIG. 1 is a cross-sectional diagram of an ion-doped structure at two sides of the conventional gate structure.
Figure 2:
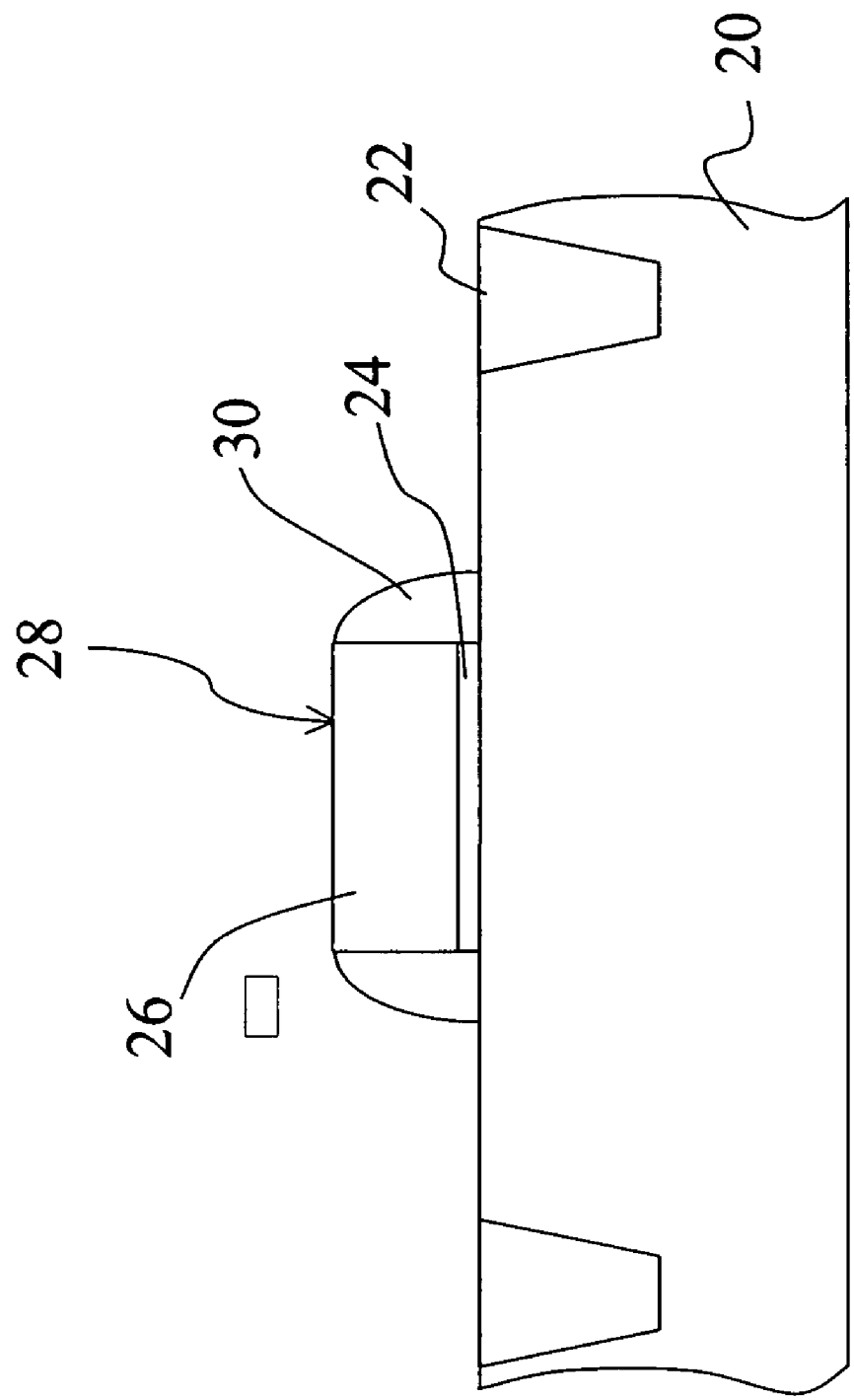
FIGS. 2-6 are cross-sectional structure views of each step according to the present invention.

First, referring to FIG. 2, a plurality of shallow trench isolations (STI) 22 are formed in the semiconductor substrate 20 to isolate active devices and passive ones in the semiconductor substrate 20. Then, a gate oxide layer 24 is formed on the surface of the semiconductor substrate 20, and a polysilicon layer 26 is formed on gate oxide layer 24. Thus, a transistor gate structure 28, which includes gate oxide layer 24 and polysilicon layer 26, is formed. Later, a silicon nitride layer is formed on the semiconductor substrate 20 by chemical vapor deposition, and then a dry etching process of reactive ion etching is performed on the silicon nitride layer to form a gate spacer 30.

Figure 3:
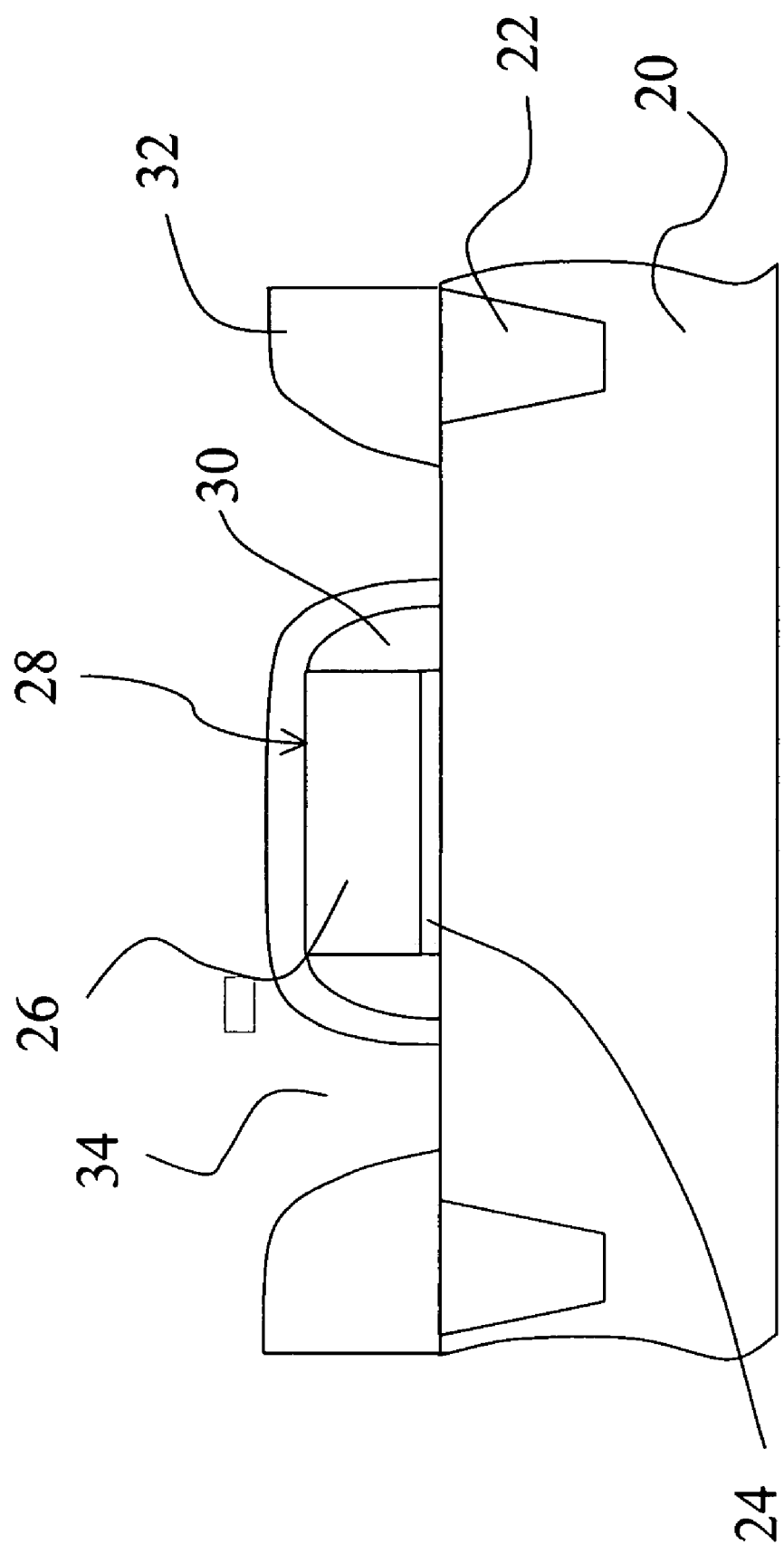

A dielectric layer 32 is formed on the semiconductor substrate 20, and the material of the dielectric layer 32 can be borophosphosilicate glass (BPSG). Then, the dielectric layer 32 is etched to form a plurality of positions located by trench 34 of two sides of the gate, as shown in FIG. 3.

Figure 4:
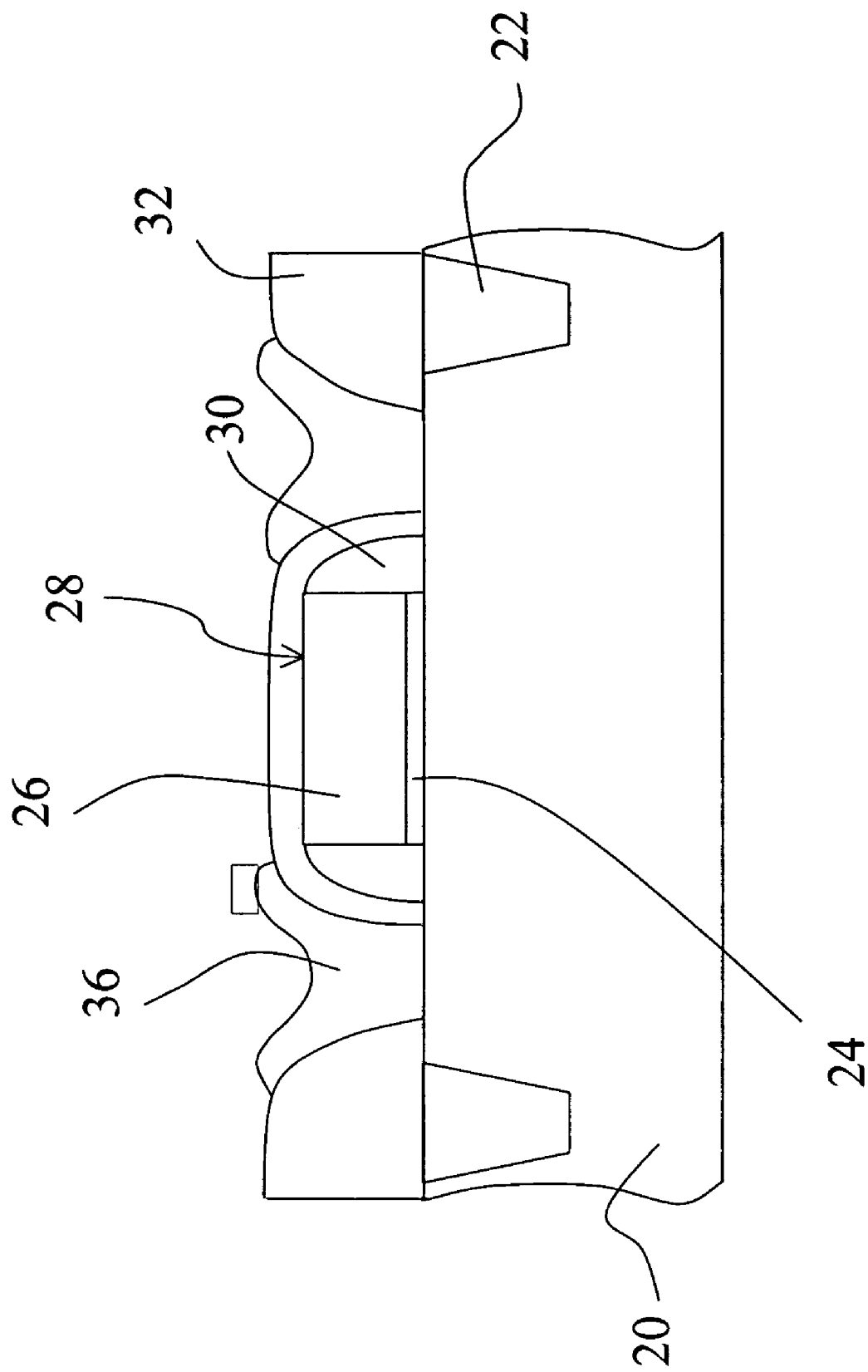

Later, a polysilicon layer 36, whose appearance is lower in the middle and higher on two sides, is formed in the trenches 34, as shown in FIG. 4. The way of forming the polysilicon layer 36 is to deposit the polysilicon layer 36, which fills trenches 34 first. Then, performing an etching process makes the appearance of polysilicon layer 36 be Y-shaped.

Figure 5:
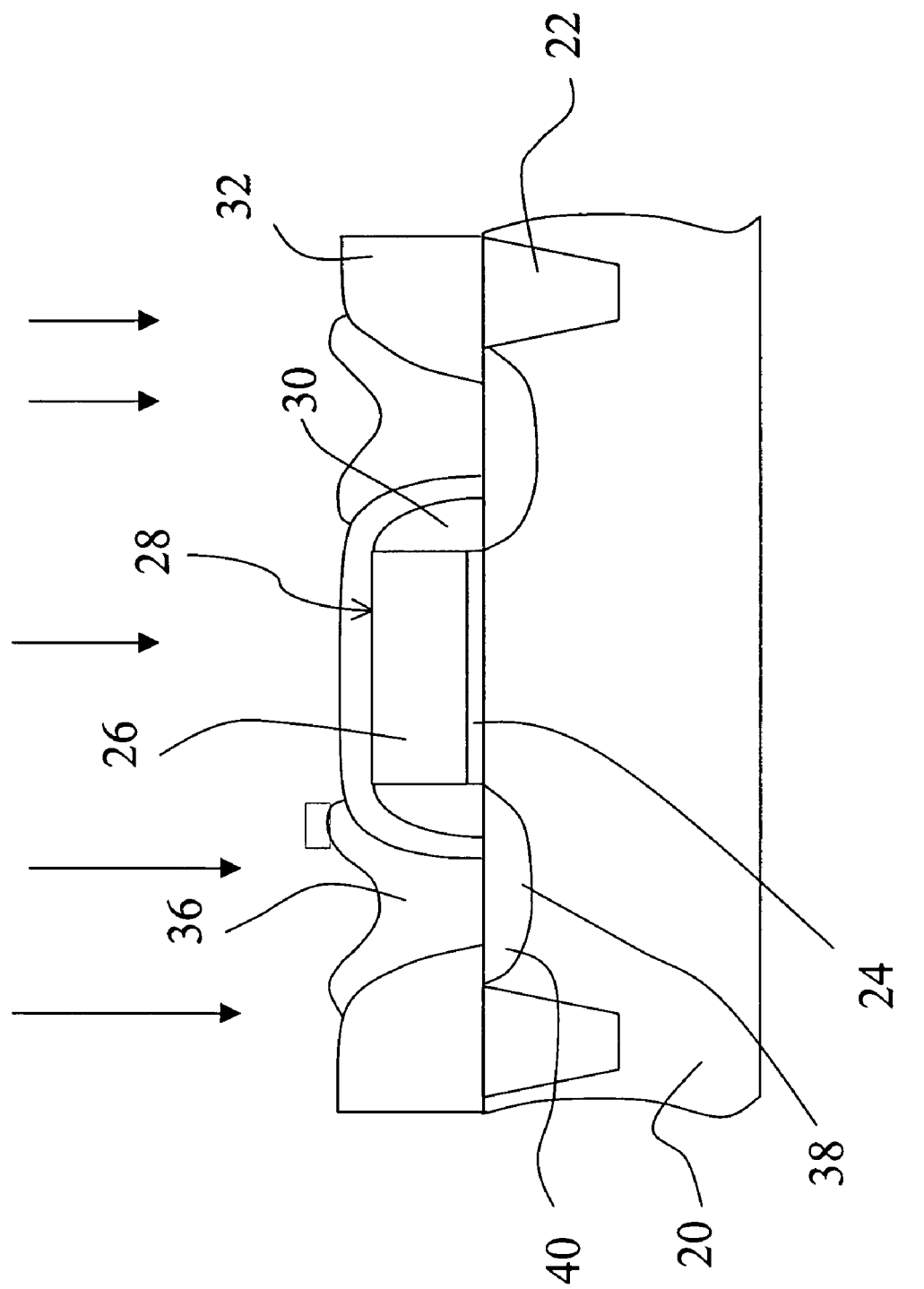

Then, referring to FIG. 5, perform an ion implantation process on the semiconductor substrate 20. At this time, when ions are implanted into the semiconductor substrate 20, these ions will be impeded by different material layers. Therefore, lightly doped source/drain regions 38 and heavily doped source/drain regions 40 are formed. For instance, the ions implanted into the lower position in the middle of the polysilicon layer 36 are only impeded by the polysilicon layer 36. When the amount of ions implanted into the semiconductor substrate 20 increases, heavily doped source/drain regions 40 are formed. However, the ions implanted into two sides of the polysilicon layer 36 are impeded by the polysilicon layer 36, the dielectric layer 32 and the gate spacer 30, and thus the amount of ions implanted into the semiconductor substrate 20 decreases a lot, so lightly doped source/drain regions 38 are formed. Besides, the height of the gate spacer 30 closer to the gate structure 28 gets higher, i.e. this causes a larger impendent to ions. Because of this factor, the appearance of lightly doped source/drain regions 38 will show a good distribution of the concentration gradient.

Figure 6:
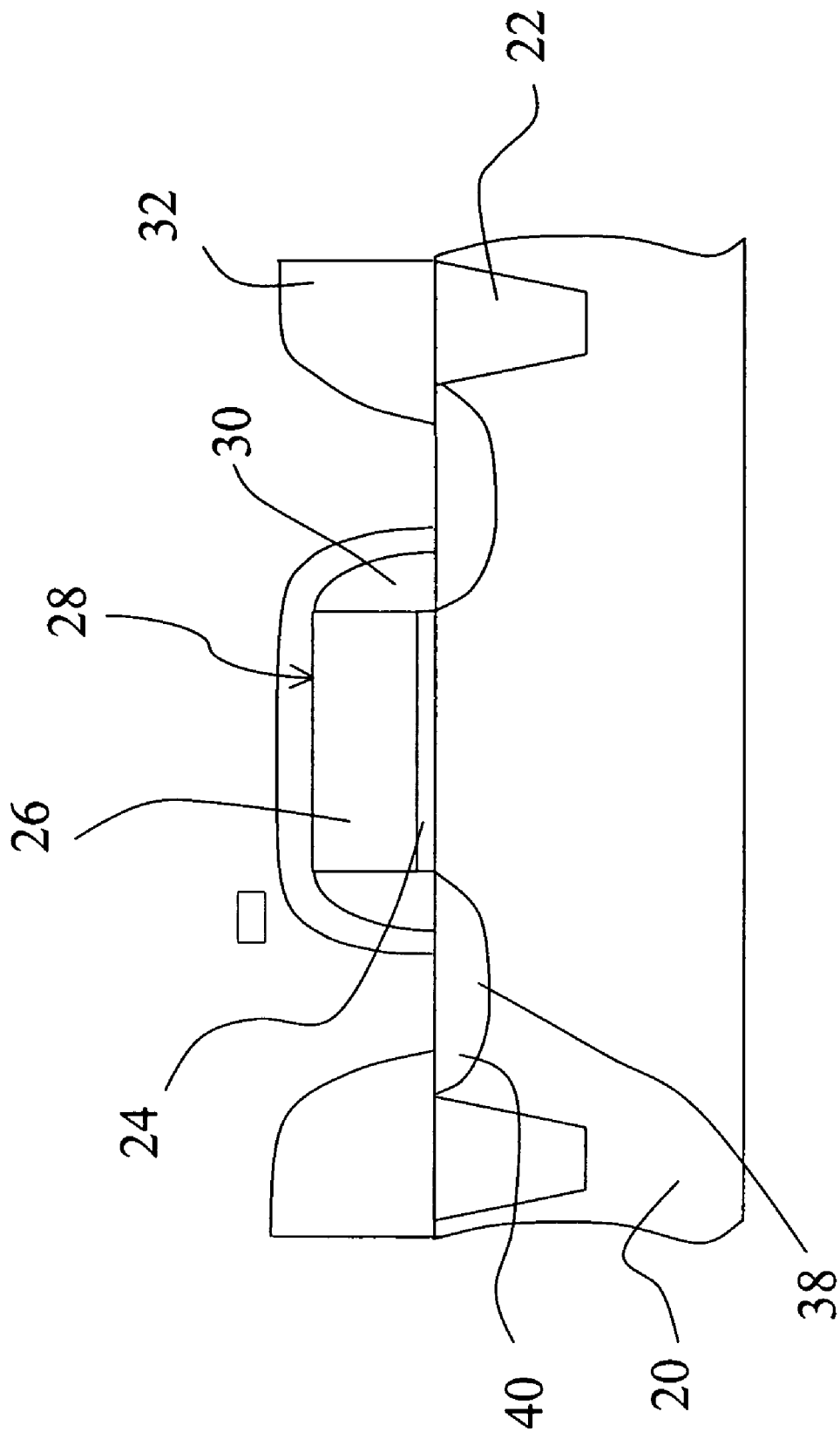

Afterwards, the polysilicon layer 36 is removed, and thus the manufacturing of lightly doped source/drain regions 38 and heavily doped source/drain regions 40 of the gate structure is finished, as shown in FIG. 6. Then, the semiconductor substrate 20 can be annealed to recover the impaired Si-lattice atoms, which are caused by the ion implantation, of the surface of the semiconductor substrate 20.

In summary, the present invention is an ion doping method to form source and drain, and solves the conventional problem. When the conventional manufacturing process is at the deep submicron scale, the side length of the lightly doped exterior region makes a channel length shorter in doping ions to form source and drain. Thus, the invention solves this conventional problem. Further, this invention is suitable for a small scale device manufacturing to effectively control the size of the overlapping regions between the lightly doped side length and the gate structure to make the minimized components still keep a longer channel length.

Although the present invention has been described with reference to the preferred embodiment thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

What is claimed is:

1. An ion doping method to form a source and drain, comprising the steps of:

providing a semiconductor substrate which has isolation regions formed therein;

forming a gate structure and a gate spacer on the semiconductor substrate;

depositing a dielectric layer on the semiconductor substrate, and etching the dielectric layer to form a plurality of trenches, and the trenches showing a position of source/drain of the gate structure;

forming a polysilicon layer whose appearance is Y-shaped in the trenches;

performing an ion doping process, by using the polysilicon layer, the dielectric layer and the gate spacer as a mask, to form lightly doped source/drain regions and heavily doped source/drain regions in the gate structure; and removing the polysilicon layer to complete gate components.

2. The ion doping method to form source and drain according to claim 1, wherein the dielectric layer is borophosphosilicate glass.

3. The ion doping method to form source and drain according to claim 1, wherein the polysilicon layer whose appearance is Y-shaped is formed by depositing the polysilicon layer on the semiconductor first and then etching the polysilicon layer.

4. The ion doping method to form source and drain according to claim 1, wherein after completing an ion implantation process, the semiconductor substrate is annealed to repair damage caused by ions implanted into the semiconductor substrate.

5. The ion doping method to form source and drain according to claim 1, wherein the gate spacer is silicon nitride.

6. The ion doping method to form source and drain according to claim 1, wherein the gate spacer is formed by a dry etching technology of reactive ion etching.

7. The ion doping method to form source and drain according to claim 1, wherein the gate structure includes a gate oxide layer and a second polysilicon layer located on the gate oxide layer.

* * * * *